United States Patent [19]
Morita et al.

[11] Patent Number: 5,411,236
[45] Date of Patent: May 2, 1995

[54] REINFORCING METAL FITTING FOR SURFACE MOUNT CONNECTOR

[75] Inventors: Shigehiro Morita; Akira Shirai, both of Tokyo, Japan

[73] Assignee: Hirose Electric Co., Ltd., Tokyo, Japan

[21] Appl. No.: 805,686

[22] Filed: Dec. 12, 1991

[30] Foreign Application Priority Data

Dec. 25, 1990 [JP] Japan .................. 2-404153 U

[51] Int. Cl.⁶ .............................................. A47B 97/00
[52] U.S. Cl. .............................. 248/500; 228/180.21; 248/205.1
[58] Field of Search .................... 248/500, 205.1; 403/271, 272; 228/180.21, 903, 214, 259, 223, 224; 156/244, 22, 66

[56] References Cited

U.S. PATENT DOCUMENTS

| 1,634,675 | 8/1925 | Mattice | 403/272 X |
| 2,784,284 | 3/1957 | Zunick | 403/272 X |
| 2,890,070 | 6/1959 | Aversten | 403/272 X |
| 3,095,951 | 7/1963 | Rood et al. | 403/272 |
| 3,226,140 | 12/1965 | Voegeli | 403/272 |
| 3,512,811 | 1/1968 | Bardgette et al. | 403/272 X |
| 3,790,120 | 2/1974 | Wise | 403/272 X |
| 4,561,670 | 12/1985 | Takada | 403/272 X |

Primary Examiner—Ramon O. Ramirez
Assistant Examiner—Korie H. Chan
Attorney, Agent, or Firm—Kanesaka & Takeuchi

[57] ABSTRACT

A mounting part (14) for a surface mount connector (11) to be mounted on a board (16) which includes a substantially L-shaped body having a vertical section (21) and a horizontal section (20); and a stepped opening (18) or soldering tongue (52) formed on the horizontal section for increasing an attachment strength between the mounting part and the board.

2 Claims, 4 Drawing Sheets

REINFORCING METAL FITTING FOR SURFACE MOUNT CONNECTOR

BACKGROUND OF THE INVENTION

1. Field of the Invention

The present invention relates to mounting parts for surface mount connectors.

2. Description of the Prior Art

FIG. 11 shows a conventional connector assembly 1 which includes a connector body 2. A pair of positioning projections 3 extend downwardly from the opposite end portions of a board-side face 2a of the connector body 2. A large number of L-shaped terminals 5 extend upwardly from the upper face of the connector body 2. A pair of mounting parts 4 are attached to opposite ends of the connector body 2.

In FIG. 12, the mounting part 4 is made by bending a plated metal piece along an intermediate line at right angles. The front edge of a horizontal section 4a is bent at right angles to form a bent portion 4b. A pair of J-shaped hooks 4d extend laterally from the upper portions of a vertical section 4c to form a fixing section. A pair of stepped portions 2b are formed on opposite ends of the connector body 2. A pair of cutouts 2c are formed on the stepped portions 2b. The mounting parts 4 are fixed to the connector body 2 so that the fixing section 4c is fitted into the cutout 2c while the J-shaped hooks 4d abut on the stepped portion 2b.

In FIG. 13, the connector assembly 1 is placed on the mounting face of a board 6 on which solder paste 7 has been applied so that the solder 7 can adhere to both bottom and side faces of the horizontal section 4a of the mounting part 4, thereby securing the mounting part 4 to the board 6.

However, since only the bottom and side faces of the horizontal section are secured to the board 6, it is necessary to increase the length of the horizontal section 4a of the mounting part 4 in order to assure satisfactory attachment strength between the mounting part and the board.

SUMMARY OF THE INVENTION

Accordingly, it is an object of the invention to provide a mounting part for surface mount connectors, which has a compact horizontal section but is able to provide a satisfactory attachment strength between the mounting part and the board.

According to the invention there is provided a mounting part for a surface mount connector to be mounted on a board which includes a substantially L-shaped body having a vertical section and a horizontal section; and a securing portion formed on the horizontal section for increasing an attachment strength between the mounting part and the board.

According to an embodiment of the invention, the securing portion is a stepped opening so that the solder can adhere to not only the bottom of the securing portion but also the side wall of the stepped opening, thereby increasing the attachment strength between the mounting part and the board.

According to another embodiment of the invention, the securing portion is a soldering tongue made by erecting a pair of portions on opposite sides so that the solder can adhere not only the bottom of the securing portion but also the side wall of the soldering tongue, thereby increasing the attachment strength between the mounting part and the board.

The above and other objects, features, and advantages of the invention will be more apparent from the following description when taken in conjunction with the accompanying drawings.

DESCRIPTION OF THE PREFERRED EMBODIMENT

Figure 1:
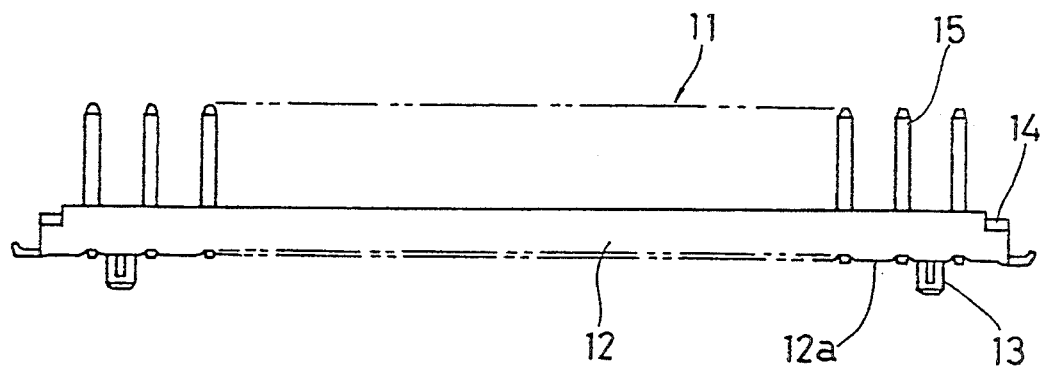
FIG. 1 is a front view of a surface mount connector with a pair of mounting parts fixed to opposite ends.
Figure 2:
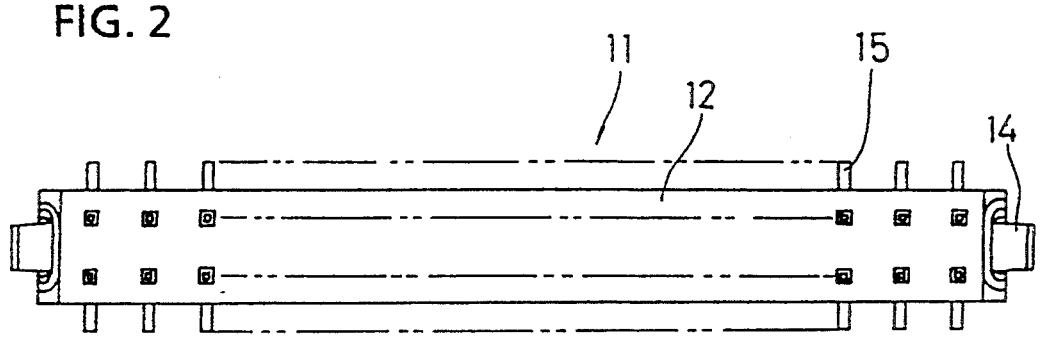
FIG. 2 is a top view of the surface mount connector.
Figure 3:
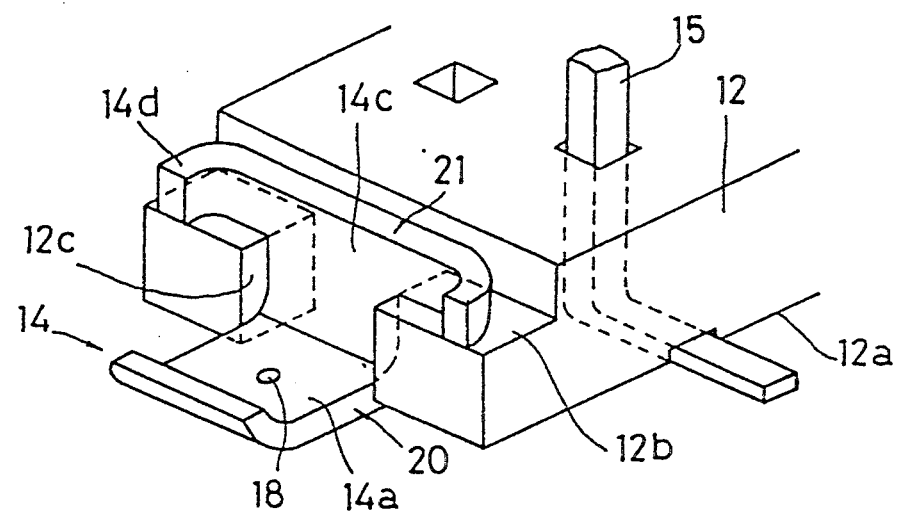
FIG. 3 is a perspective view of the mounting part fixed to an end of the surface mount connector.

In FIGS. 1-3, a connector assembly 11 includes a connector body 12 and a pair of mounting parts 14 attached to opposite ends of the connector body 12. A pair of positioning projections 12 extend downwardly from a board-side face 12a of the connector body 12. A large number of L-shaped terminals 15 extend upwardly from the upper face of the connector body 12.

In FIG. 3, a pair of stepped portions 12b are formed on opposite ends of the connector body 12. A pair of cutouts 12c are formed on the stepped portions 12b for receiving the fixing section of the mounting part 14.

Figure 4:
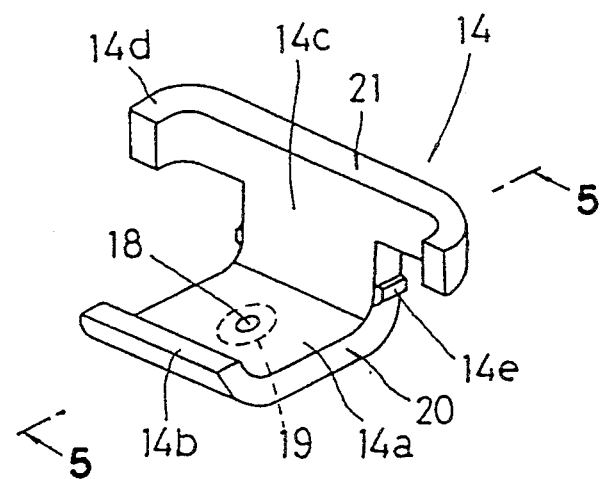
FIG. 4 is a perspective view of the mounting part according to an embodiment of the invention.

In FIG. 4, the mounting part 14 is made by bending a plated metal piece along an intermediate line at right angles. The front edge of a horizontal section 14a is bent at right angles to form a bent portion 14b. A stepped opening 18 is formed on the horizontal section 14a to form a securing portion 20.

Figure 5:
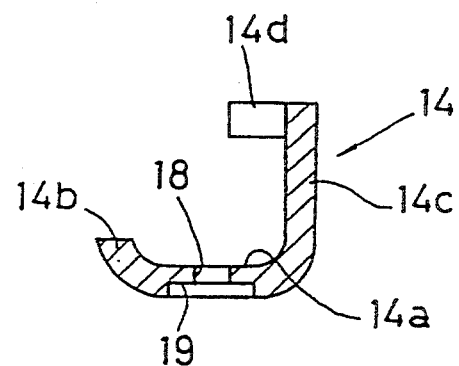
FIG. 5 is a sectional view taken along line 5—5 of FIG. 4.

In FIG. 5, the stepped opening 18 is made by pressing the bottom face of a plated metal piece to form a step portion 19 and then punching out an opening 18 concentrically with the step portion 19 so that there remains a plating layer on the side walls of the stepped portion 19 and the opening 18. A pair of J-shaped hooks 14d extend laterally from the upper portions of a vertical section 14c and a pair of projections 14e are formed on the side walls of the vertical section 14c to form a securing section 21 of the mounting part 14.

As FIG. 3 shows, the connector mounting part is fixed to the connector body 12 such that the securing section 21 is fitted into the cutout 12c while the J-shaped hooks 14d abut on the stepped portion 12b. It is noted that the horizontal face 14a of the mounting part 14 is parallel to the board-side face 12a of the connector body 12.

Figure 6:
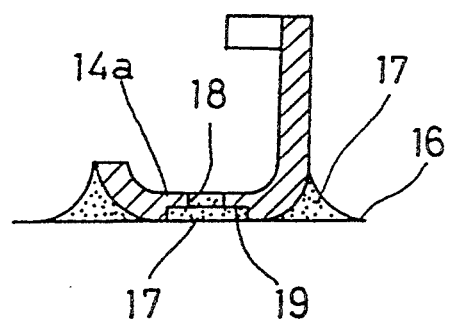
FIG. 6 is a sectional view, similar to FIG. 5, of the mounting part mounted on a board.

In FIG. 6, the connector assembly 11 is placed on the mounting face of a board 16 on which a solder paste 17 has been applied so that the solder 17 can adhere to not only the bottom face of the securing section 20 of the mounting part 14 but also the stepped opening 18 to thereby increase the attachment strength between the mounting part 14 to the board 16.

According to the above embodiment, the securing portion permits the solder to adhere to not only the bottom of the securing portion but also the plating layer on the side wall of the stepped opening, thereby increasing the attachment strength between the mounting part and the board.

Figure 7:
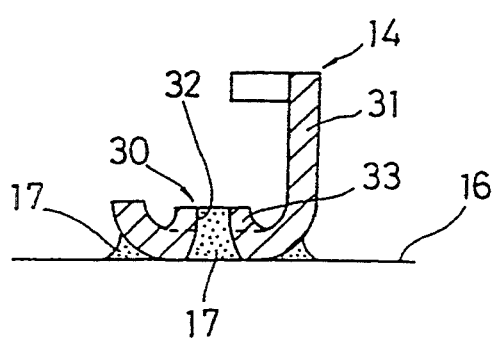
FIG. 7 is a sectional view, similar to FIG. 5, of a mounting part according to another embodiment of the invention.

In FIG. 7, the mounting part 14 is identical with that of FIG. 4 except for an opening 32 which is made on the securing portion 30 by exclusion. That is, the opening 32 is excluded from the securing portion 30 of a plated metal part 14 to form a raised rim 33 around the opening 32 such that the plating layer remains on the inside wall of the opening 32.

The fixing portion 31 of the mounting part 14 is fixed to the connector body 12 by the procedure as described above, and the connector assembly 11 is placed on the mounting face of a board 16 so that the solder 17 adheres to the bottom of the securing portion 30 and the inside wall of the excluded opening 32 to thereby increase the attachment strength between the mounting part 14 and the board 16.

In the above embodiment, the excluded opening permits the solder to adhere to not only the bottom of the securing portion but also the inside plated wall of an opening on the securing portion to thereby increase the attachment strength between the mounting part and the board.

Figure 8:
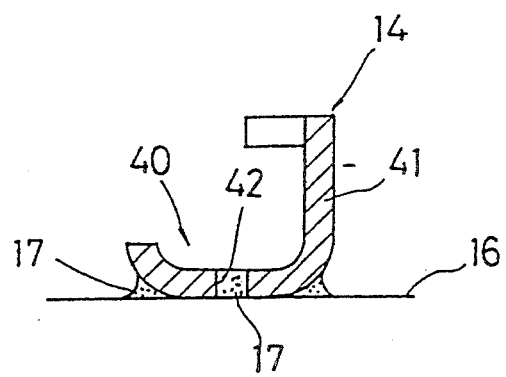
FIG. 8 a sectional view, similar to FIG. 5, of a mounting part according to still another embodiment of the invention.

In FIG. 8, the mounting part 14 is identical with that of FIG. 4 except for an opening 42 which is punched out of the securing portion 40. That is, the opening 42 is made by punching it out of the securing portion 40 of a plated metal part 14.

The fixing portion 41 of the mounting part 14 is fixed to the connector body 12, and the connector assembly 11 is placed on the mounting face of a board 16 so that the solder 17 adheres to not only the bottom of the securing portion 40 but also the inside wall of the punched out opening 42 to thereby increase the attachment strength between the mounting part 14 to the board 16.

According to this embodiment, the punched-out opening permits the solder to adheres to not only the bottom of the securing portion but also the inside wall of the punched-out opening to thereby increase the attachment strength between the mounting part and the board.

Figure 9:
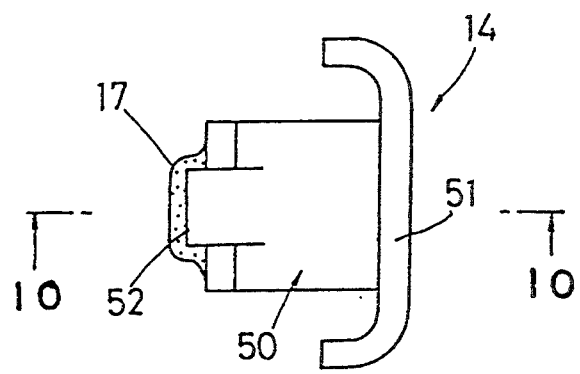
FIG. 9 is a top view of a mounting part according to yet another embodiment of the invention.
Figure 10:
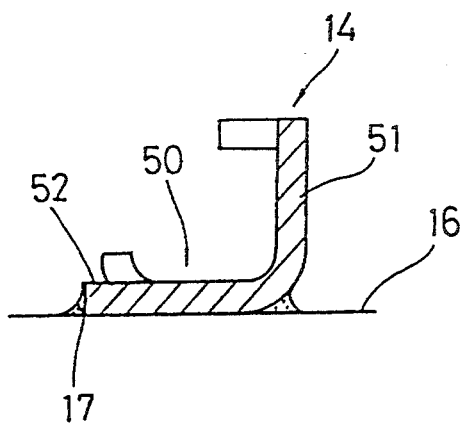
FIG. 10 is a sectional view taken along line 10—10 of FIG. 9.
Figure 11:
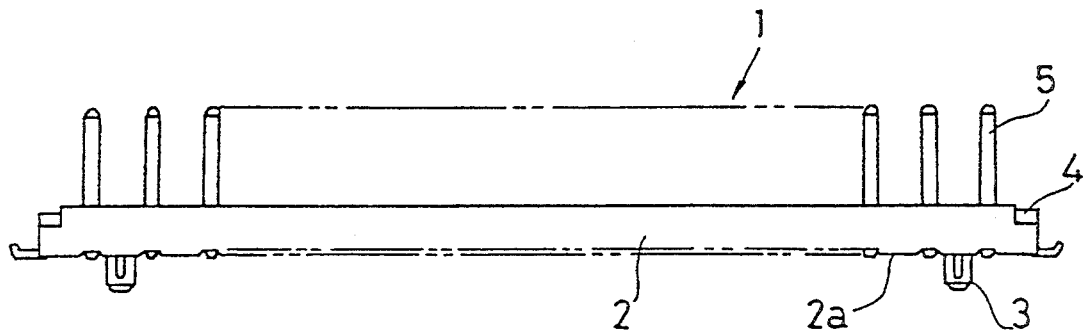
FIG. 11 is a front view of a surface mount connector with a pair of conventional mounting parts.
Figure 12:
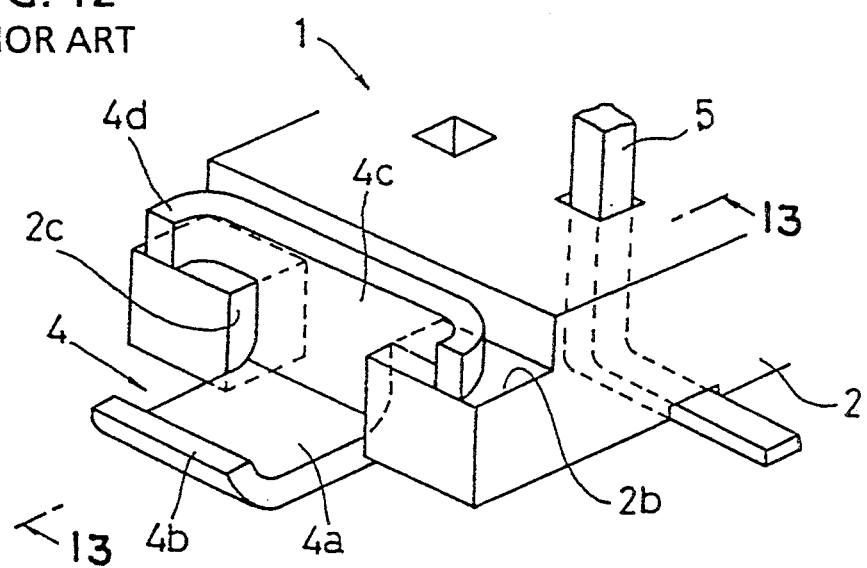
FIG. 12 is a perspective view of the conventional mounting part.
Figure 13:
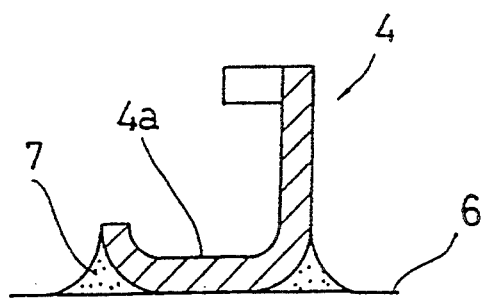
FIG. 13 is a sectional view taken along line 13—13 of FIG. 12.

In FIGS. 9 and 10, the mounting part 14 is identical with that of FIG. 4 except for a soldering tongue 52 which is made by erecting a pair of end portions on opposite sides from the front portion of a plated securing section 50.

The fixing portion 51 of the mounting part 14 is fixed to the connector body 12, and the connector assembly 11 is placed on the mounting face of a board 16 so that the solder 17 adheres to not only the bottom of the securing section 50 but also the side wall of the soldering tongue 52 to thereby increase the attachment strength between the mounting part 14 and the board 16.

According to this embodiment, the soldering tongue permits the solder to adhere to not only the bottom of the securing portion but also the side wall of the soldering tongue to thereby increase the attachment strength between the mounting part and the board.

We claim:

1. A mounting part for surface-mounting an electrical connector on a board, comprising:
   a substantially L-shaped body having a vertical section and a horizontal section;
   an opening formed in said horizontal section and having a side face plated with solder thereby facilitating surface-mount soldering, wherein said opening comprises upper and lower concentric circular holes, said lower hole having a diameter greater than that of said upper hole to provide a step portion between them, facing said mounting surface, said step portion being plated with solder, thereby not only facilitating surface-mounting soldering but also increasing surface-mount soldering strength.

2. A mounting part for surface-mounting an electrical connector on a board, comprising:
   a substantially L-shaped body having a vertical section and a horizontal section;
   an opening formed in said horizontal section and having a side face plated with solder thereby facilitating surface-mount soldering, wherein said opening has a raised rim forming a truncated conical inside wall having a diameter which decreases from bottom to top and being plated with solder, thereby not only facilitating surface-mount soldering but also increasing surface-mount soldering strength.

* * * * *